(12) United States Patent
Yu

(10) Patent No.: US 6,763,410 B2
(45) Date of Patent: Jul. 13, 2004

(54) PORTABLE UNIVERSAL SERIAL BUS MEMORY DEVICE

(75) Inventor: Hong-Chi Yu, Kaohsiung (TW)

(73) Assignee: Walton Advanced Engineering, Inc., Kaohsiung (TW)

( * ) Notice: Subject to any disclaimer, the term of this patent is extended or adjusted under 35 U.S.C. 154(b) by 0 days.

(21) Appl. No.: 10/385,173

(22) Filed: Mar. 10, 2003

(65) Prior Publication Data

US 2004/0083320 A1 Apr. 29, 2004

(30) Foreign Application Priority Data

Oct. 28, 2002 (TW) ........................................ 91217218 U

(51) Int. Cl.⁷ ................................................. G06F 1/16
(52) U.S. Cl. ........................... 710/74; 710/62; 710/313; 361/737
(58) Field of Search ................................. 361/735–753; 235/441; 439/135–137; 710/62–64, 72–74, 300–304, 313–315; 713/200

(56) References Cited

U.S. PATENT DOCUMENTS

| | | | | |
|---|---|---|---|---|
| 6,435,409 B1 * | 8/2002 | Hu | ......................... | 235/441 |
| 6,456,500 B1 * | 9/2002 | Chen | ......................... | 361/752 |
| 6,490,163 B1 * | 12/2002 | Pua et al. | ......................... | 361/737 |
| 6,522,534 B1 * | 2/2003 | Wu | ......................... | 361/686 |
| 6,561,421 B1 * | 5/2003 | Yu | ......................... | 235/451 |
| 6,567,273 B1 * | 5/2003 | Liu et al. | ......................... | 361/737 |
| 6,612,853 B2 * | 9/2003 | Wu | ......................... | 439/136 |
| 6,671,808 B1 * | 12/2003 | Abbott et al. | ......................... | 713/200 |
| 2003/0043111 A1 * | 3/2003 | Huang | ......................... | 345/156 |
| 2003/0223286 A1 * | 12/2003 | Lee | ......................... | 365/200 |

FOREIGN PATENT DOCUMENTS

EP        1260929 A1 * 11/2002        ............ G06K/7/00

* cited by examiner

Primary Examiner—Christopher B. Shin
(74) Attorney, Agent, or Firm—William E. Pelton, Esq.

(57) ABSTRACT

A portable USB memory device has a housing, a memory and driver board and a USB plug. The memory and driver board has a memory IC, a driver IC and some electronic components so that the thickness of the memory device is decreased and the memory device is only 3 times larger than the USB plug. The memory device is small enough small to adapt to mount in an external housing, which further is adapted to attach to other devices like key chains, belts, etc.

9 Claims, 3 Drawing Sheets

PORTABLE UNIVERSAL SERIAL BUS MEMORY DEVICE

BACKGROUND OF THE INVENTION

1. Field of the Invention

The present invention relates to a portable universal serial bus (USB) memory device, and more specifically to a memory device that is thin so it can be easily adapted to mounted in pieces of a body, such as a frame of a belt, pendant, etc.

2. Description of Related Art

Small and portable memory products have a variety of configurations, such as CF card, MS card, SD card and SM card to adapt to corresponding electronic devices. One portable memory product that is thumb shaped is an improved memory device for an electronic device, such as a computer.

With reference to FIG. 8, the thumb shaped memory device with a large memory capacity includes a housing (60), a cap (63), a driver IC (not shown) on a first PCB (70), a memory IC (81) on a second PCB (80) and a USB plug (90). The USB plug (90) is a standard and fixed size, and the thumb shaped memory device is five times the size of the USB plug (90).

The housing (60) has an upper shell (61), a bottom shell (62) and an opening (64). The first, second PCBs (70, 80) and the USB plug (90) are mounted in the housing (10). The second PCB (80) is mounted on the first PCB (70). The USB plug (90) is horizontally connected to a side of the first PCB (70) and a part of the USB plug (90) protrudes through the opening (64) in the housing (60). The USB plug (90) of the thumb shaped memory device inserts into a USB socket on a computer (not shown), and then the memory IC (81) and the computer (not shown) execute a dual storing procedure through the driver IC. The thumb shaped memory device is small than a 1.44M floppy disk so that the thumb shaped memory device is easily carried. In addition, most computer systems can support the USB protocol so that the thumb memory device can be read directly by the computer without specific driver software. The cap (63) covers and protects the USB plug (90) from dust.

The USB plug (90) protrudes from the housing (60) and increases the length of thumb shaped memory device. Further, stacking the first and second PCBs increases the thickness of the thumb shaped memory device. Although the thumb shaped memory device is smaller than a 1.44M floppy disk, the memory cards previously mentioned are smaller than the thumb shaped memory device. Whereby, the thumb shaped memory device is not small enough to carry easily. Furthermore, the cap (63) must be removed before the USB plug (90) can be inserted into the computer. Removing the cap (63) from the thumb shaped memory device may not be simply, and the cap (63) can be lost easily.

The present invention provides a portable memory device that is small and has many others additional functions to mitigate or obviate the aforementioned problems.

SUMMARY OF THE INVENTION

An objective of the present invention is to provide a portable memory device for a computer that is only three times than a USB plug so that the portable memory can be easily carried.

Another objective of the present invention is to provide a portable memory device with a dustproof cap that is convenient and easy to use will not be lost easily.

Other objectives, advantages and novel features of the invention will become more apparent from the following detailed description when taken in conjunction with the accompanying drawings.

DETAILED DESCRIPTION OF THE PREFERRED EMBODIMENT

Figure 8:
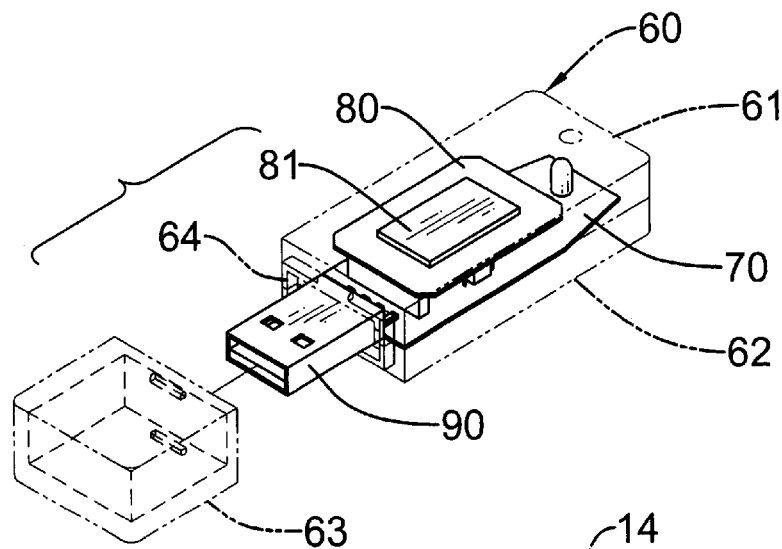
FIG. 8 is a partially exploded perspective view of a conventional thumb shaped portable memory device.
Figure 1:
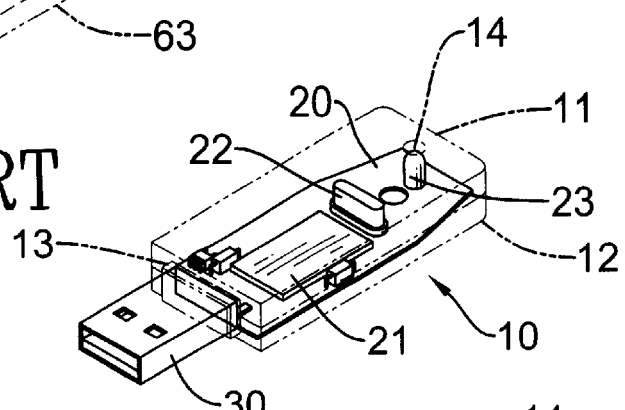
FIG. 1 is a perspective view of a first embodiment of a portable memory device in accordance with the present invention.

With reference to FIG. 1, a first preferred embodiment of a portable memory device comprises a housing (10), a memory and driver board (20) and a USB plug (30). The USB plug (30) has distal end (not numbered) and a proximal end (not numbered). The memory device including the housing (10) and the USB plug (30) is 3 times larger than the USB plug (30) or less.

The forgoing components are mounted in the housing (10), and the housing (10) has an upper shell (11), a bottom shell (12), two short sides (not numbered) and two long sides (not numbered). An opening (13) is defined in one short side of the housing (10). A window (14) is defined in the upper shell (11).

The memory and driver board (20) mounted in the housing (10) includes a memory IC (not shown), a driver IC (21), an oscillator (22), an LED (23), discrete electric components and four edges (not numbered). The memory IC is mounted under the memory and driver board (20). One edge of the memory and driver board (20) facing the opening (13) and the proximal end of the USB plug (30) are combined together with a soldering process. Most of the USB plug (30) protrudes through the opening (13) in the housing (10). The LED (23) is mounted on the memory and driver board (20) and corresponds to the window (14) to indicate the operating state of the driver IC (21). The memory unit can be any memory size.

The memory device as described only uses one PCB with the memory unit and the driver IC (21) mounted on the PCB so the memory device is thin. Therefore the portable memory device is small.

Figure 2:
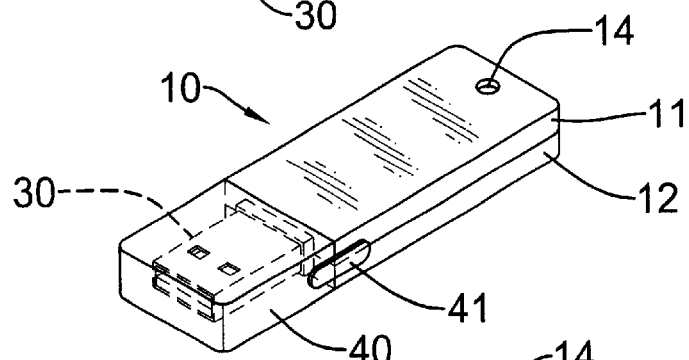
FIG. 2 is a perspective view of a second embodiment of a portable memory device in accordance with the present invention.

With reference to FIG. 2, a second preferred embodiment of the portable memory device in accordance with the present invention includes a dustproof cap (40) and a flexible strap hinge (41). The dustproof cap (40) is covered on the to the USB plug (30) protruded from the housing (10).

Figure 3:
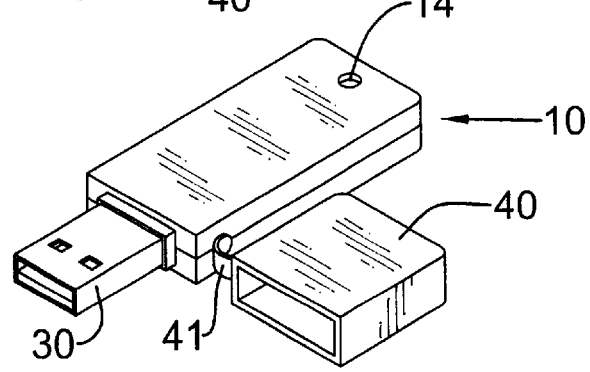
FIG. 3 is an operational perspective view of the portable memory device in FIG. 2.

The flexible strap hinge (41) is connected between the dustproof cap (40) and the long side of the housing (10). With reference to FIG. 3, the dustproof cap (40) still is connected to the housing (10) when the dustproof cap (40) is open so that the dustproof cap (40) is not lost. The dustproof cap (40) and the flexible strap hinge (41) can be formed as a single piece.

Figure 4:
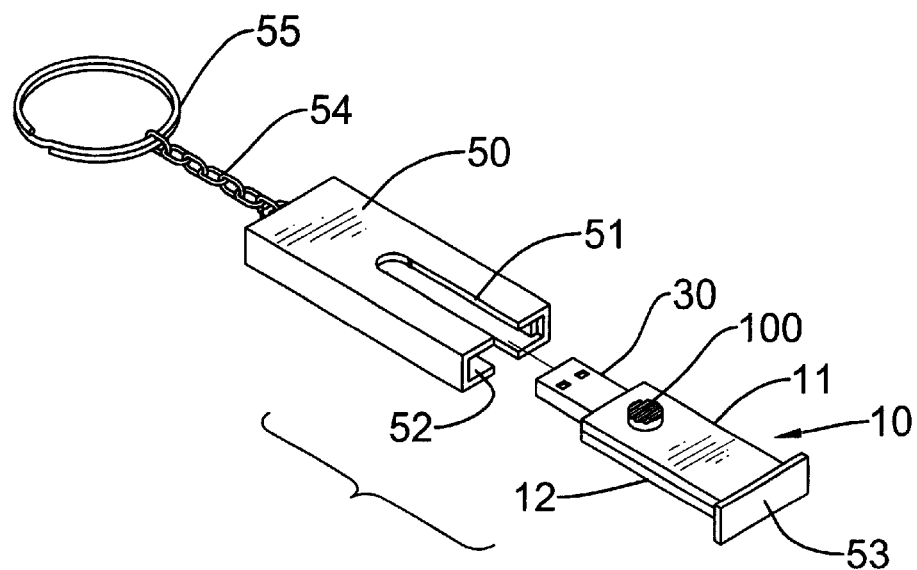
FIG. 4 is an exploded perspective view of a third embodiment of a portable memory device in accordance with the present invention in use.
Figure 5:
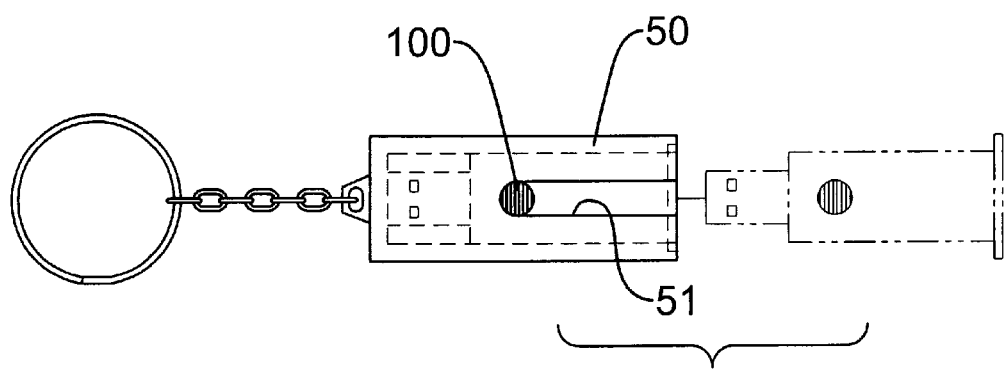
FIG. 5 is a top plan view of the portable memory device in FIG. 4.

With reference to FIG. 4, a third preferred embodiment of the portable memory device in accordance with the present invention comprises an external housing (50) to hold the housing (10) and the USB plug (30) protruding from the housing (10). The external housing (50) includes two narrow sides (not numbered), two broad sides (not numbered), a closed end (not numbered), an open end (52) and an end plate (53). Two keyways (51) are respectively defined in the two broad sides. Two keys (100) corresponding to the keyways (51) are formed on the upper and bottom shells (11,12). With reference to FIG. 5, the end plate (53) on the housing (10) covers the open end (52) when the portable memory device is inserted into the open end (52) of the external housing (50). The external housing (10) can be further connected to a chain (54) with a key ring (55).

Figure 6:
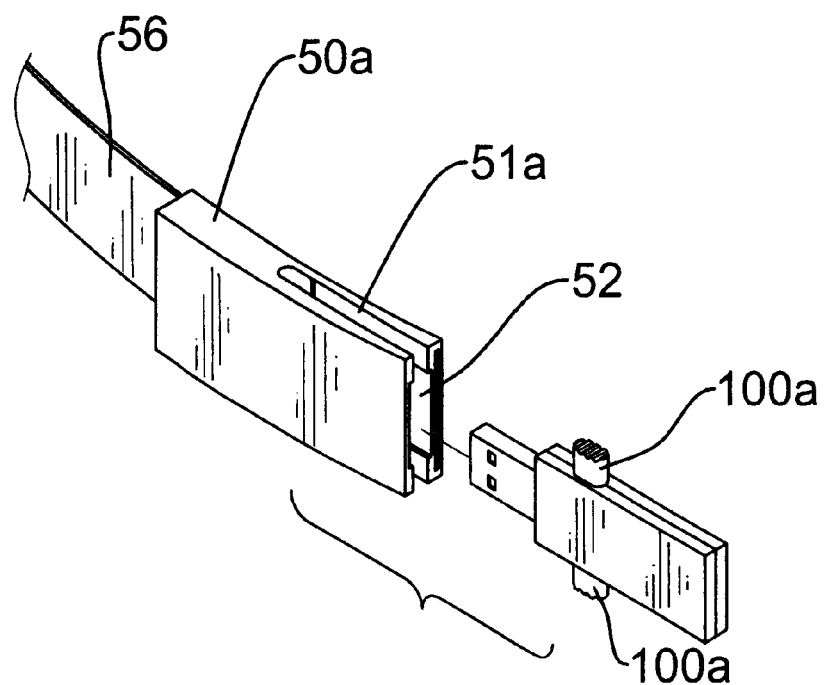
FIG. 6 is an exploded perspective view of a fourth embodiment of a portable memory device in accordance with the present invention in use.
Figure 7:
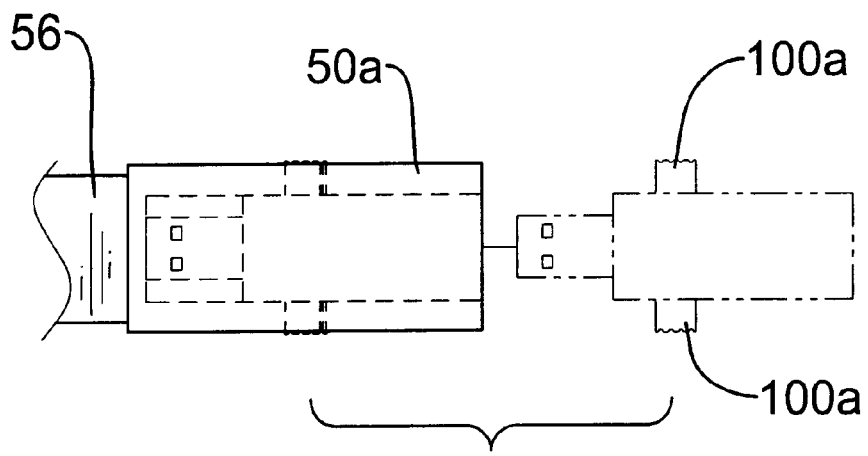
FIG. 7 is a top plan view of the portable memory device in FIG. 6.

With reference to FIG. 6, a fourth preferred embodiment of the portable memory device in accordance with the present invention is similar to the third preferred embodiment. Two keyways (51a) are formed in the two narrow sides respectively of the external housing (50a). The keyways (51a) communicate with the open end (52) of the external housing (50a). Two keys (100a) corresponding to the two keyways (51a) are formed on the two long sides of the housing (10). The closed end of the external housing (50a) is further connected to a belt (56). With reference to FIG. 7, the portable memory device is easily pulled out of the external housing (50a) by the two keys (100a) to separate the portable memory device from the external housing (50a).

The memory unit and the driver unit are deposited on the same PCB to reduce the thickness of the memory device that is only 3 times larger than the USB plug or less. Therefore, the memory device can be adapted to use a small dustproof cap to decorate the memory device and keep dust off the USB plug.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A portable USB memory device, comprising
   a housing having two short sides, two long sides and an opening;
   a memory and driver board mounted in the housing, wherein the memory and driver board has a memory IC, a driver IC and edges with one edge facing the opening; and
   a USB plug connected to the edge facing the opening and protruding from the opening; wherein
   the memory IC and the driver IC are deposited on the memory and driver board to make the housing with the USB plug 3 times larger than the USB plug or less.

2. The portable USB memory device as claimed in claim 1, further comprises a dustproof cap for covering the USB plug protruding from the housing, which is connected to one long side of the housing by a flexible strap is hinge.

3. The portable USB memory device as claimed in claim 2, wherein the flexible strap hinge and the dustproof cap are formed as a single piece.

4. The portable USB memory device as claimed in claim 1, further comprises an external housing for covering the housing and the USB plug protruding from the housing has two narrow sides, two broad sides, a closed end and an open end, wherein
   two keyways are respectively defined in the two broads sides and communicate with the open end; and
   two keys corresponding to the two keyways are respectively formed on the upper shell and bottom shell.

5. The portable USB memory device as claimed in claim 4, wherein the closed end of the external housing is adapted to connect to a chain connected a key ring.

6. The portable USB memory device as claimed in claim 1, further comprises an external housing for covering the housing and the USB plug protruding from the housing has two narrow sides, two broad sides, a closed end and an open end, wherein
   two keyways are respectively defined on the two narrow sides and are communicate with the open end; and
   two keys corresponding to the two keyways are respectively formed on the two long sides of the housing.

7. The portable USB memory device as claimed in claim 6, wherein the closed end of the external housing is adapted to connect to a belt.

8. The portable USB memory device as claimed in claim 1, wherein the memory and driver board further comprises an oscillator and a LED, wherein a window corresponding to the LED is defined on the upper housing.

9. The portable USB memory device as claimed in claim 1, wherein the USB plug is soldered to the memory and driver board.

* * * * *